United States Patent
Lim et al.

(10) Patent No.: US 12,507,565 B2
(45) Date of Patent: Dec. 23, 2025

(54) COLOR CONVERSION PANEL AND DISPLAY DEVICE INCLUDING THE SAME, AND MANUFACTURING METHOD THEREOF

(71) Applicant: Samsung Display Co., LTD., Yongin-si (KR)

(72) Inventors: Tae Woo Lim, Cheonan-si (KR); Moon Soon Kim, Asan-si (KR); Jae-Seung Kim, Hwaseong-si (KR); Seung Hui Seo, Pyeongtaek-si (KR); Moon-Keun Choi, Hwaseong-si (KR); Sang Beom Han, Hwaseong-si (KR); Ki Pyo Hong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 581 days.

(21) Appl. No.: 17/661,700

(22) Filed: May 2, 2022

(65) Prior Publication Data
US 2023/0005995 A1    Jan. 5, 2023

(30) Foreign Application Priority Data
Jul. 5, 2021   (KR) .................. 10-2021-0088036

(51) Int. Cl.
| | | |
|---|---|---|
| H10K 59/38 | (2023.01) | |
| B41M 3/00 | (2006.01) | |
| G02B 5/20 | (2006.01) | |
| H10K 59/122 | (2023.01) | |
| H10K 77/10 | (2023.01) | |
| H10K 102/00 | (2023.01) | |

(52) U.S. Cl.
CPC ............. *H10K 59/38* (2023.02); *B41M 3/003* (2013.01); *G02B 5/201* (2013.01); *H10K 59/122* (2023.02); *H10K 77/111* (2023.02); *H10K 2102/311* (2023.02); *H10K 2102/331* (2023.02)

(58) Field of Classification Search
CPC . H10K 59/38; H10K 59/122; H10K 2102/331
See application file for complete search history.

(56) References Cited

U.S. PATENT DOCUMENTS

| | | | | |
|---|---|---|---|---|
| 2019/0214440 A1* | 7/2019 | Lee | ................. | G06F 3/0412 |
| 2020/0212113 A1* | 7/2020 | Song | .................... | H10K 59/122 |

FOREIGN PATENT DOCUMENTS

| | | |
|---|---|---|
| CN | 110288904 A | 9/2019 |
| JP | 2020-194018 A | 12/2020 |
| KR | 10-2012-0111912 A | 10/2012 |

* cited by examiner

*Primary Examiner* — Samuel A Gebremariam
*Assistant Examiner* — Jonas T Beardsley
(74) *Attorney, Agent, or Firm* — Womble Bond Dickinson (US) LLP

(57) ABSTRACT

A color conversion panel includes: a substrate; a plurality of color filters on the substrate; a partition wall on the substrate, and including a first opening, a second opening, a third opening, and a sub-opening; a first color conversion layer disposed in the first opening of the partition wall; a second color conversion layer disposed in the second opening of the partition wall; a transmission layer disposed in the third opening of the partition wall; an additional layer disposed in the sub-opening of the partition wall; and a spacer on the additional layer.

22 Claims, 15 Drawing Sheets

COLOR CONVERSION PANEL AND DISPLAY DEVICE INCLUDING THE SAME, AND MANUFACTURING METHOD THEREOF

CROSS-REFERENCE TO RELATED APPLICATION

This application claims priority to and the benefit of Korean Patent Application No. 10-2021-0088036, filed in the Korean Intellectual Property Office on Jul. 5, 2021, the entire content of which is incorporated by reference herein.

BACKGROUND

1. Field

Aspects of embodiments of the present disclosure relate to a color conversion panel, a display device including the same, and a manufacturing method thereof.

2. Description of the Related Art

A color conversion panel and a display device including the same have been proposed in order to reduce light loss of a flat panel display, and display high-efficiency colors.

It may be desirable to increase efficiency of color-converted light in the color conversion panel, and efficiently manufacture the color conversion layer simultaneously.

When an interval between the color conversion panel and a display panel of the display device is not constant, display quality may deteriorate, such as through brightness changes depending on a position thereof. In particular, when a height of a spacer formed on the color conversion panel is unnecessarily increased, light leakage may occur around the spacer.

The above information disclosed in this Background section is for enhancement of understanding of the background of the present disclosure, and therefore, it may contain information that does not constitute prior art.

SUMMARY

Some embodiments of the present disclosure are directed to a color conversion panel, a display device including the same, and a manufacturing method thereof, in which a constant or substantially constant distance between the display panel and the color conversion panel of the display device may be maintained or substantially maintained by preventing or substantially preventing a spacer from having an unnecessarily increased height.

However, the present disclosure is not limited to the above-described aspects and features, and other aspects and features may be included within the spirit and scope of the present disclosure.

According to one or more embodiments of the present disclosure, a color conversion panel includes: a substrate; a plurality of color filters on the substrate; a partition wall on the substrate, and including a first opening, a second opening, a third opening, and a sub-opening; a first color conversion layer disposed in the first opening of the partition wall; a second color conversion layer disposed in the second opening of the partition wall; a transmission layer disposed in the third opening of the partition wall; an additional layer disposed in the sub-opening of the partition wall; and a spacer on the additional layer.

In an embodiment, the sub-opening may be connected to the third opening; and the additional layer may be at a same layer as that of the transmission layer.

In an embodiment, the partition wall may further include a fourth opening spaced from the first opening, the second opening, and the third opening. \

In an embodiment, the transmission layer may be configured to transmit light of a first wavelength; the first color conversion layer may be configured to convert the light of the first wavelength to light of a second wavelength; the second color conversion layer may be configured to convert the light of the first wavelength to light of a third wavelength, the color filters may include a first color filter, a second color filter, and a third color filter; the first color filter, the second color filter, and the third color filter may overlap with each other at a light blocking region; the partition wall may overlap with the light blocking region; the first opening may overlap with the third color filter; the second opening may overlap with the second color filter; and the third opening may overlap with the first color filter.

In an embodiment, the sub-opening may be connected to the first opening or the second opening; and the additional layer may be at a same layer as that of the first color conversion layer or the second color conversion layer.

In an embodiment, the partition wall may further include a fourth opening spaced from the first opening, the second opening, and the third opening.

In an embodiment, the transmission layer may be configured to transmit light of a first wavelength; the first color conversion layer may be configured to convert the light of the first wavelength to light of a second wavelength; the second color conversion layer may be configured to convert the light of the first wavelength to light of a third wavelength; the color filters may include a first color filter, a second color filter, and a third color filter; the first color filter, the second color filter, and the third color filter may overlap with each other at a light blocking region; the partition wall may overlap with the light blocking region; the first opening may overlap with the third color filter; the second opening may overlap with the second color filter; and the third opening may overlap with the first color filter.

According to one or more embodiments of the present disclosure, a display device includes: a display panel including: a first substrate; a thin film transistor on the first substrate; a pixel definition layer on the thin film transistor; and a plurality of emission layers at regions defined by the pixel definition layer; a second substrate facing the first substrate; a plurality of color filters between the first substrate and the second substrate; a partition wall between the second substrate and the color filters, and including a first opening, a second opening, a third opening, and a sub-opening; a first color conversion layer disposed in the first opening of the partition wall; a second color conversion layer disposed in the second opening of the partition wall; a transmission layer disposed in the third opening of the partition wall; an additional layer disposed in the sub-opening of the partition wall; and a spacer overlapping with the additional layer.

In an embodiment, the sub-opening may be connected to the third opening; and the additional layer may be at a same layer as that of the transmission layer.

In an embodiment, the partition wall may further include a fourth opening spaced from the first opening, the second opening, and the third opening.

In an embodiment, the transmission layer may be configured to transmit light of a first wavelength; the first color conversion layer may be configured to convert the light of the first wavelength to light of a second wavelength; the second color conversion layer may be configured to convert the light of the first wavelength to light of a third wavelength; the color filters may include a first color filter, a second color filter, and a third color filter; the first color filter, the second color filter, and the third color filter may overlap with each other at a light blocking region; the partition wall may overlap with the light blocking region; the first opening may overlap with the third color filter; the second opening may overlap with the second color filter; and the third opening may overlap with the first color filter.

In an embodiment, the sub-opening may be connected to the first opening or the second opening; and the additional layer may be at a same layer as that of the first color conversion layer or the second color conversion layer.

In an embodiment, the partition wall may further include a fourth opening spaced from the first opening, the second opening, and the third opening.

In an embodiment, the transmission layer may be configured to transmit light of a first wavelength; the first color conversion layer may be configured to convert the light of the first wavelength to light of a second wavelength; the second color conversion layer may be configured to convert the light of the first wavelength to light of a third wavelength; the color filters may include a first color filter, a second color filter, and a third color filter; the first color filter, the second color filter, and the third color filter may overlap with each other at a light blocking region; the partition wall may overlap with the light blocking region; the first opening may overlap with the third color filter; the second opening may overlap with the second color filter; and the third opening may overlap with the first color filter.

According to one or more embodiments of the present disclosure, a manufacturing method of a color conversion panel, includes: forming a plurality of color filters on a substrate; forming a partition wall including a first opening, a second opening, a third opening, and a sub-opening on the color filters; forming a first color conversion layer in the first opening of the partition wall; forming a second color conversion layer in the second opening of the partition wall; forming a transmission layer in the third opening of the partition wall; forming an additional layer in the sub-opening of the partition wall; and forming a spacer on the additional layer.

In an embodiment, the forming of the first color conversion layer, the forming of the second color conversion layer, and the forming of the transmission layer may be performed utilizing an inkjet process.

In an embodiment, the method may further include forming a fourth opening spaced from the first opening, the second opening, and the third opening in the forming of the partition wall, and an ink dripped on the partition wall may be disposed in the fourth opening in the inkjet process.

In an embodiment, the sub-opening may be formed to be connected to at least one of the first opening, the second opening, or the third opening.

In an embodiment, the sub-opening may be formed to be connected to the third opening; and the additional layer may be formed of a same layer as that of the transmission layer.

In an embodiment, the sub-opening may be formed to be connected to the first opening or the second opening; and the additional layer may be formed at a same layer as that of the first color conversion layer or the second color conversion layer.

According to one or more embodiments of the present disclosure, it may be possible to prevent or substantially prevent the height of the spacer from being unnecessarily increased, thereby maintaining or constantly maintaining a distance between the display panel of the display device and the color conversion panel.

However, the present disclosure is not limited to the above-described aspects and features, and other aspects and features may be included within the spirit and scope of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
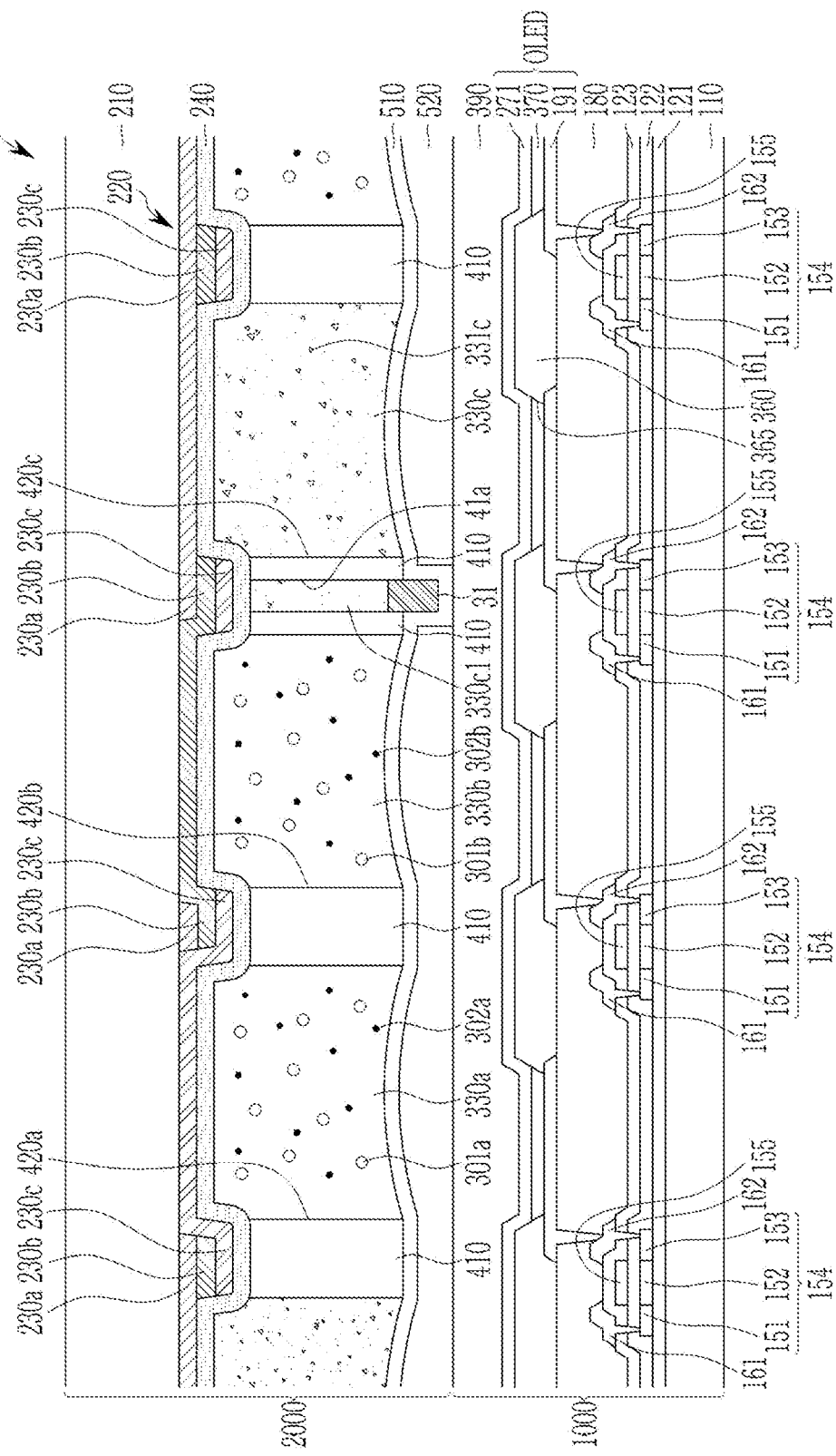
FIG. 1 illustrates a cross-sectional view of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, as used in the present specification, the terms "on" or "above" may refer to positioned on or below the object portion, and thus, does not necessarily mean positioned on an upper side of the object portion based on a gravitational direction.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

Further, as used herein, the phrase "in a plan view" may refer to a view of a relevant object portion when viewed from above, and the phrase "in a cross-sectional view" may refer to a view of a relevant object portion when a cross-section taken by vertically cutting the relevant object portion is viewed from the side.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display device according to an embodiment will be described with reference to FIG. 1. FIG. 1 illustrates a cross-sectional view of a display device according to an embodiment.

Referring to FIG. 1, a display device according to an embodiment includes a display panel 1000 and a color conversion panel 2000. In some embodiments, the display device may further include a touch unit (e.g., a touch sensing panel or a touch sensing layer), and the touch unit may be disposed between the display panel 1000 and the color conversion panel 2000.

First, the display panel 1000 will be described in more detail.

The display panel 1000 includes a first substrate 110, and a buffer layer 121 is disposed on the first substrate 110. The first substrate 110 may include a flexible material, for example, such as plastic, that may be curved, bent, folded, and/or curled.

The buffer layer 121 may include silicon nitride ($SiN_x$), silicon oxide ($SiO_2$), or the like. The buffer layer 121 may be disposed between the first substrate 110 and a semiconductor layer 154 to improve a characteristic of polysilicon by blocking impurities from the first substrate 110, and to relieve a stress of the semiconductor layer 154 disposed on the buffer layer 121 by flattening or substantially flattening the first substrate 110 during a crystallization process to form the polysilicon.

The semiconductor layer 154 is disposed on the buffer layer 121. The semiconductor layer 154 may be formed of polycrystalline silicon or an oxide semiconductor. The semiconductor layer 154 includes a channel region 152, a source region 151, and a drain region 153. The source region 151 and the drain region 153 are disposed at opposite sides of the channel region 152, respectively. The channel region 152 may be an intrinsic semiconductor that is not doped with an impurity, and the source region 151 and the drain region 153 may be impurity semiconductors doped with a conductive impurity. The semiconductor layer 154 may be formed by using an oxide semiconductor, and in this case, a separate protective layer may be further included to protect an oxide semiconductor material that may be vulnerable to external environments, for example, such as a high temperature.

A gate insulating layer 122 covering the semiconductor layer 154 is disposed on the semiconductor layer 154. The gate insulating layer 122 may be a single layer or multiple layers including at least one of silicon nitride ($SiN_x$) or silicon oxide ($SiO_2$).

A gate electrode 155 is disposed on the gate insulating layer 122. The gate electrode 155 may be multilayers in which a metal film including any suitable one of copper (Cu), a copper alloy, aluminum (Al), an aluminum alloy, molybdenum (Mo), and/or a molybdenum alloy is stacked.

An interlayer insulating layer 123 is disposed on the gate electrode 155 and the gate insulating layer 122. The interlayer insulating layer 123 may include silicon nitride ($SiN_x$), silicon oxide ($SiO_2$), or the like. Openings exposing the source region 151 and the drain region 153, respectively, may penetrate (e.g., may extend through) the interlayer insulating layer 123.

A source electrode 161 and a drain electrode 162 may be disposed on the interlayer insulating layer 123. The source electrode 161 and the drain electrode 162 are connected to the source region 151 and the drain region 153, respectively, of the semiconductor layer 154 through openings formed in the interlayer insulating layer 123 and the gate insulating layer 122.

A passivation layer 180 is disposed on the interlayer insulating layer 123, the source electrode 161, and the drain electrode 162. Because the passivation layer 180 covers and planarizes or substantially planarizes the interlayer insulating layer 123, the source electrode 161, and the drain electrode 162, a pixel electrode 191 may be formed on the passivation layer 180 without a step difference. The passivation layer 180 may include (e.g., may be made of) an organic material, for example, such as a polyacrylate resin or a polyimide resin, or may include a stacked layer of one or more organic materials and one or more inorganic materials.

The pixel electrode 191 is disposed on the planarization layer 180. The pixel electrode 191 is connected to the drain electrode 162 through an opening of (e.g., penetrating or extending through) the passivation layer 180.

A driving transistor formed to include the gate electrode 155, the semiconductor layer 154, the source electrode 161, and the drain electrode 162 may be connected to the pixel electrode 191 to supply a driving current to an organic light emitting diode OLED. The display device according to the present embodiment may further include a switching transistor connected to a data line to transfer a data voltage in response to a scan signal, and a compensation transistor connected to the driving transistor to compensate for a threshold voltage of the driving transistor in response to a scan signal, in addition to the driving transistor illustrated in FIG. 1.

A pixel definition layer 360 is disposed on the passivation layer 180 and the pixel electrode 191, and the pixel definition layer 360 has a pixel opening 365 that overlaps with the pixel electrode 191 and defines an emission area. The pixel definition layer 360 may include an organic material, for example, such as a polyacrylate resin or a polyimide resin, or a silica-based inorganic material. The pixel opening 365 may have a planar shape that is substantially similar to that of the pixel electrode 191. The pixel opening 365 may have an octagonal shape similar to a rhombus or a rhombus shape in a plan view, but the present disclosure is not limited thereto, and the pixel opening 365 may have any suitable shape in a plan view, for example, such as a quadrangle or a polygon.

An organic emission layer 370 is disposed on the pixel electrode 191 overlapping with the pixel opening 365. The organic emission layer 370 may be formed to include a low molecular organic material or a polymer organic material, for example, such as poly(3,4-ethylenedioxythiophene) (PEDOT). In addition, the organic emission layer 370 may be a multilayer further including at least one of a hole injection layer (HIL), a hole transporting layer (HTL), an electron transporting layer (ETL), or an electron injection layer (EIL).

Most of the organic emission layer 370 may be disposed within the pixel opening 365, and may also be disposed on a side surface of the pixel definition layer 360 or on the pixel definition layer 360.

A common electrode 271 may be disposed on the organic emission layer 370. The common electrode 271 may be disposed across a plurality of pixels, and may receive a common voltage through a common voltage transfer unit (e.g., a common voltage source) at (e.g., in or on) a non-display area.

The pixel electrode 191, the organic emission layer 370, and the common electrode 271 may constitute an organic light emitting element OLED.

In some embodiments, the pixel electrode 191 may be an anode that is a hole injection electrode, and the common electrode 271 may be a cathode that is an electron injection electrode. However, the present disclosure is not limited thereto, and the pixel electrode 191 may be a cathode and the common electrode 271 may be an anode according to (e.g., depending on) a driving method of an organic light emitting diode display.

When holes and electrons are injected from the pixel electrode 191 and the common electrode 271 into the organic emission layer 370, excitons formed by combining the injected holes and electrons are emitted when they fall from an excited state to a ground state.

An encapsulation layer 390 is disposed on the common electrode 271. The encapsulation layer 390 may seal the display panel 1000 by covering not only an upper surface of a display layer including the organic light emitting element OLED, but also a side surface thereof.

Because the organic light emitting element OLED may be vulnerable to moisture and/or oxygen, the encapsulation layer 390 seals the display layer to block an inflow of external moisture and oxygen. The encapsulation layer 390 may include a plurality of layers. For example, the encapsulation layer 390 may be formed as a composite layer including both an inorganic layer and an organic layer, and/or may be formed as a triple layer in which an inorganic layer, an organic layer, and an inorganic layer are sequentially formed.

The color conversion panel 2000 is disposed on the encapsulation layer 390.

The color conversion panel 2000 includes a second substrate 210 facing the first substrate 110 of the display panel 1000. The second substrate 210 may include a flexible material, for example, such as plastic, that may be curved, bent, folded, and/or curled.

A first color filter 230a, a second color filter 230b, a third color filter 230c, a first insulating layer 240, a partition wall 410, a first color conversion layer 330a, a second color conversion layer 330b, a transmission layer 330c, a sub-transmission layer 330c1, a spacer 31, and a second insulating layer 510 are disposed between the second substrate 210 and the display panel 1000.

In the color conversion panel 2000, an overlapping region where the first color filter 230a, the second color filter 230b, and the third color filter 230c overlap with each other may provide a light blocking region 220 without using a separate light blocking member.

A filling layer 520 is disposed between the second insulating layer 510 and the display panel 1000.

The partition wall 410 is disposed to overlap with the pixel definition layer 360 of the display panel 1000. In other words, the partition wall 410 is disposed to overlap with an opaque region of the display panel 1000, and the first color conversion layer 330a, the second color conversion layer 330b, and the transmission layer 330c are disposed to overlap with an emission area of the display panel 1000.

In addition, the partition wall 410 is disposed to overlap with the light blocking region 220 of the color conversion panel 2000.

The partition wall 410 may have a first opening 420a overlapping with the third color filter 230c, a second opening 420b overlapping with the second color filter 230b, a third opening 420c overlapping with the first color filter 230a, and a first sub-opening 41a overlapping with the light blocking region 220 in which the first color filter 230a, the second color filter 230b, and the third color filter 230c overlap with each other.

The first color conversion layer 330a, the second color conversion layer 330b, and the transmission layer 330c are disposed at (e.g., in or on) regions surrounded (e.g., around peripheries thereof) by the partition wall 410, respectively. In more detail, the first color conversion layer 330a is disposed in the first opening 420a of the partition wall 410, the second color conversion layer 330b is disposed in the second opening 420b of the partition wall 410, and the transmission layer 330c is disposed in the third opening 420c of the partition wall 410. In addition, the sub-transmission layer 330c1 may be disposed in the first sub-opening 41a of the partition wall 410.

The spacer 31 overlaps with the sub-transmission layer 330c1 disposed in the first sub-opening 41a.

The transmissive layer 330c transmits light having a first wavelength incident from a display panel (e.g., the display panel 1000), and may include a plurality of scattering bodies 331c. In this case, light of the first wavelength may be blue light having a maximum emission peak wavelength of about 380 nm to about 480 nm (e.g., about 420 nm or more, about 430 nm or more, about 440 nm or more, or about 445 nm or more, and about 470 nm or less, about 460 nm or less, or about 455 nm or less).

The first color conversion layer 330a may color-convert light of the first wavelength incident from the display panel into light of a second wavelength, and may include a plurality of first quantum dots 301a and a plurality of scatterers 302a. In this case, the light of the second wavelength may be red light having a maximum emission peak wavelength of about 600 nm to about 650 nm (e.g., about 620 nm to about 650 nm).

The second color conversion layer 330b may color-convert the light of the first wavelength incident from the display panel into light of a third wavelength, and may include a plurality of second quantum dots 301b and a plurality of scatterers 302b. The light of the third wavelength may be green light having a maximum emission peak wavelength of about 500 nm to about 550 nm (e.g., about 510 nm to about 550 nm).

The third color filter 230c may transmit the light of the second wavelength, may absorb light of the other remaining wavelengths, and may increase purity of the light of the second wavelength emitted toward the second substrate 210 after color conversion through the first color conversion layer 330a. Similarly, the second color filter 230b may transmit the light of the third wavelength, may absorb light of the other remaining wavelengths, and may increase purity of the light of the third wavelength emitted toward the second substrate 210 after color conversion through the second color conversion layer 330b.

The first color filter 230a may transmit the light of the first wavelength passing through the transmission layer 330c, may absorb light of the other remaining wavelengths, and may increase purity of the light of the first wavelength emitted toward the second substrate 210 after passing through the transmission layer 330c.

The light blocking region 220 where the first color filter 230a, the second color filter 230b, and the third color filter 230c overlap with each other is disposed at a position overlapping with the partition wall 410, to block the light of the first wavelength emitted toward the second substrate 210 that has not been color converted in the first color conversion layer 330a and the second color conversion layer 330b, thereby increasing the purity of the light of the second wavelength and the light of the third wavelength passing through the first color conversion layer 330a and the second color conversion layer 330b.

A portion of the light blocking region 220 where the first color filter 230a, the second color filter 230b, and the third color filter 230c overlap with each other may overlap with the first sub-opening 41a of the partition wall 410.

The scattering bodies 302a, 302b, and 331c may increase light efficiency by scattering light incident onto the first color conversion layer 330a, the second color conversion layer 330b, and the transmission layer 330c.

The second insulating layer 510 may be disposed on the first color conversion layer 330a, the second color conversion layer 330b, the transmission layer 330c, the sub-transmission layer 330c1, and the spacer 31. The second insulating layer 510 prevents or substantially prevents components of the filling layer 520, which may be injected when the color conversion panel 2000 is attached to the display panel, from flowing into the first color conversion layer 330a, the second color conversion layer 330b, and the transmission layer 330c, by covering and protecting the first color conversion layer 330a, the second color conversion layer 330b, and the transmission layer 330c.

Figure 2:
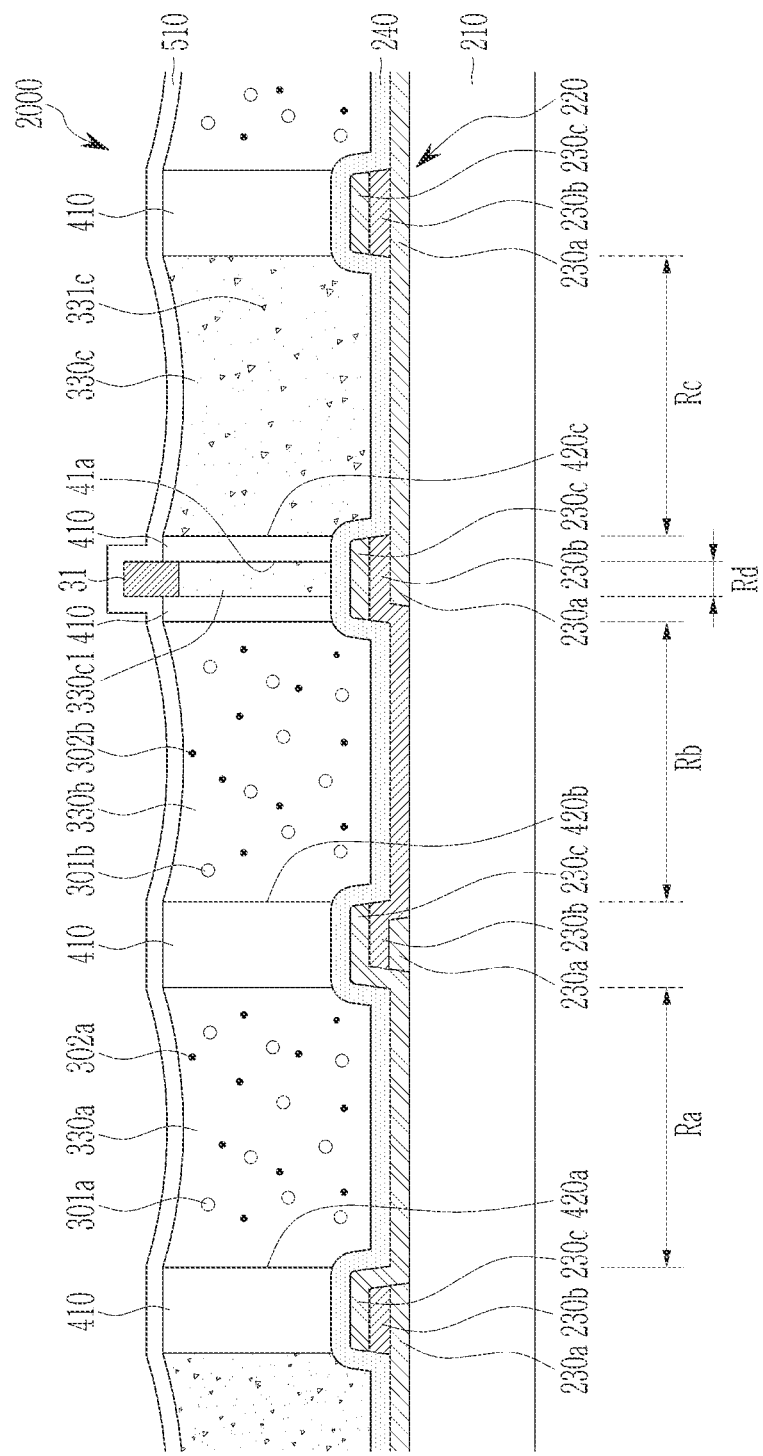
FIG. 2 illustrates a cross-sectional view of a color conversion panel according to an embodiment.

The color conversion panel 2000 according to one or more embodiments of the present disclosure will now be described in more detail with reference to FIG. 2 and FIG. 3 together with FIG. 1. FIG. 2 illustrates a cross-sectional view of a color conversion panel according to an embodiment, and FIG. 3 illustrates a top plan view of a color conversion panel according to an embodiment.

Figure 3:
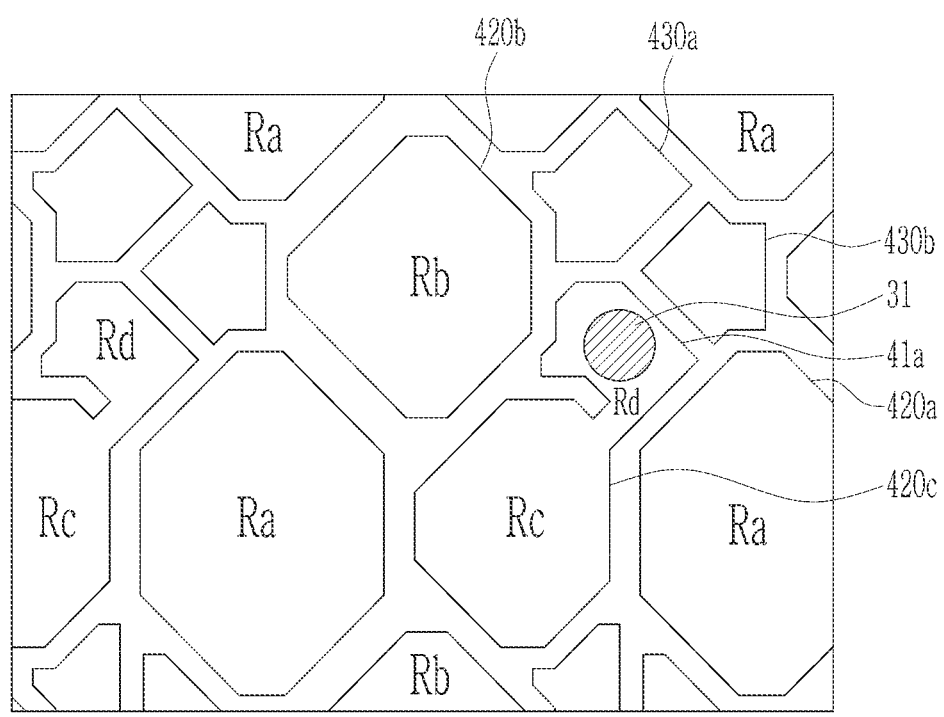
FIG. 3 illustrates a top plan view of a color conversion panel according to an embodiment.

Referring to FIG. 2 and FIG. 3 together with FIG. 1, the color conversion panel 2000 according to an embodiment includes a second substrate 210, a first color filter 230a, a second color filter 230b, and a third color filter 230c disposed on the second substrate 210.

The second substrate 210 may include a flexible material, for example, such as plastic, that may be be curved, bent, folded, and/or curled.

The first color filter 230a, the second color filter 230b, and the third color filter 230c overlap with each other to constitute the light blocking region 220. The light blocking region 220 may prevent or substantially prevent light passing through the first color conversion layer 330a, the second color conversion layer 330b, and the transmission layer 330c from being mixed and viewed, thereby increasing a contrast ratio of the display device.

The third color filter 230c is disposed at (e.g., in or on) a first area Ra, the second color filter 230b is disposed at (e.g., in or on) a second area Rb, and the first color filter 230a is disposed at (e.g., in or on) a third area Rc. A portion of the light blocking region 220 where the first color filter 230a, the second color filter 230b, and the third color filter 230c overlap with each other constitutes a fourth area Rd. In some embodiments, the fourth region Rd may be connected to the third region Rc (e.g., see FIG. 3).

The first insulating layer 240 is disposed on the first color filter 230a, the second color filter 230b, and the third color filter 230c. The first insulating layer 240 prevents or substantially prevents components of the first color filter 230a, the second color filter 230b, and the third color filter 230c from being diffused to the outside.

The partition wall 410 is disposed on the light blocking region 220 where the first color filter 230a, the second color filter 230b, and the third color filter 230c overlap with each other.

The partition wall 410 may define areas in which the first color conversion layer 330a, the second color conversion layer 330b, and the transmission layer 330c are disposed. The partition wall 410 may have a first opening 420a overlapping with the third color filter 230c, a second opening 420b overlapping with the second color filter 230b, a third opening 420c overlapping with the first color filter 230a, and a first sub-opening 41a overlapping with the light blocking region 220 in which the first color filter 230a, the second color filter 230b, and the third color filter 230c overlap with each other.

The first color conversion layer 330a, the second color conversion layer 330b, the transmission layer 330c, and the sub-transmission layer 330c1 are disposed in regions surrounded (e.g., around peripheries thereof) by the partition wall 410. In more detail, the first color conversion layer 330a is disposed in the first opening 420a of the partition wall 410, the second color conversion layer 330b is disposed in the second opening 420b of the partition wall 410, and the transmission layer 330c is disposed in the third opening 420c of the partition wall 410. In addition, the sub-transmission layer 330c1 may be disposed in the first sub-opening 41a of the partition wall 410.

In some embodiments, the first sub-opening 41a of the partition wall 410 may be connected to the third opening 420c of the partition wall 410.

The transmissive layer 330c transmits light having a first wavelength incident from a display panel (e.g., the display panel 1000), and may include a plurality of scattering bodies 331c. In this case, light of the first wavelength may be blue light having a maximum emission peak wavelength of about 380 nm to about 480 nm (e.g., about 420 nm or more, about 430 nm or more, about 440 nm or more, or about 445 nm or more, and about 470 nm or less, about 460 nm or less, or about 455 nm or less).

The first color conversion layer 330a may color-convert light of the first wavelength incident from the display panel into light of a second wavelength, and may include a plurality of first quantum dots 301a and a plurality of scatterers 302a. In this case, the light of the second wavelength may be red light having a maximum emission peak wavelength of about 600 nm to about 650 nm (e.g., about 620 nm to about 650 nm).

The second color conversion layer 330b may color-convert the light of the first wavelength incident from the display panel into light of a third wavelength, and may include a plurality of second quantum dots 301b and a plurality of scatterers 302b. The light of the third wavelength may be green light having a maximum emission peak wavelength of about 500 nm to about 550 nm (e.g., about 510 nm to about 550 nm).

Each of the first quantum dots 301a and the second quantum dots 301b (hereinafter also referred to as semiconductor nanocrystals) may independently include a Group II-VI compound, a Group III-V compound, a Group IV-VI compound, a Group IV element or compound, a Group I-III-VI compound, a Group II-III-VI compound, a Group I-II-IV-VI compound, or a combination thereof. The quantum dots may not contain cadmium.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group II-VI compound may further include a Group III metal.

The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a four-element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The Group III-V compound may further include a Group II metal (e.g., InZnP).

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof.

The Group IV element or compound may be selected from a one-element compound selected from Si, Ge, and a combination thereof; and a two-element compound selected from SiC, SiGe and a combination thereof, but the present disclosure is not limited thereto.

Examples of the Group I-III-VI compound include, but are not limited to, CuInSe2, CuInS2, CuInGaSe, and CuInGaS. Examples of the Group I-II-IV-VI compound include, but are not limited to, CuZnSnSe and CuZnSnS. The Group IV element or compound may be selected from a one-element compound selected from Si, Ge, and a mixture thereof; and a two-element compound selected from SiC, SiGe, and a mixture thereof.

The Group II-III-VI compound may be selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but the present disclosure is not limited thereto.

The Group I-II-IV-VI compound may be selected from CuZnSnSe and CuZnSnS, but the present disclosure is not limited thereto.

The quantum dots may not contain cadmium. The quantum dots may include semiconductor nanocrystals based on Group III-V compounds including indium and phosphorus. The Group III-V compounds may further contain zinc. The quantum dots may include semiconductor nanocrystals based on a Group II-VI compound including a chalcogen element (e.g., sulfur, selenium, tellurium, or a combination thereof) and zinc.

In the quantum dots, the two-element compound, the three-element compound, and/or the four-element compound described above may be present in particles at uniform or substantially uniform concentrations, or they may be divided into states having partially different concentrations to be present in the same particle, respectively. In addition, a core/shell structure in which some quantum dots surround (e.g., around a periphery of) some other quantum dots may be possible. An interface between the core and the shell may have a concentration gradient in which a concentration of elements of the shell decreases closer to a center thereof.

The quantum dot may have a core-shell structure that includes a core including the nanocrystal described above and a shell surrounding (e.g., around a periphery of) the core. The shell of the quantum dot may serve as a passivation layer for maintaining or substantially maintaining a semiconductor characteristic, and/or as a charging layer for applying an electrophoretic characteristic to the quantum dot by preventing or substantially preventing chemical denaturation of the core. The shell may be a single layer or multilayers. An interface between the core and the shell may have a concentration gradient in which a concentration of elements of the shell decreases closer to a center thereof. An example of the shell of the quantum dot includes a metal or nonmetal oxide, a semiconductor compound, or a combination thereof.

Examples of an oxide of the metal or non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO and a three-element compound such as $MgAl_2O_4$, $CoFe_2O_4$, $NiFe_2O_4$, or $CoMn_2O_4$.

In addition, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present disclosure is not limited thereto.

An interface between the core and the shell may have a concentration gradient in which a concentration of elements of the shell decreases closer to a center thereof. In addition, the semiconductor nanocrystal may have a structure including one semiconductor nanocrystal core and a multilayered shell surrounding (e.g., around a periphery of) the semiconductor nanocrystal core. The multilayered shell may have two or more layers, such as two, three, four, five, or more layers. The two adjacent layers of the shell can have a single composition or different compositions. Each layer in the multilayered shell may have a composition that varies depending on a radius.

The quantum dot may have a full width at half maximum (FWHM) of the light-emitting wavelength spectrum that is equal to or less than about 45 nm, for example, equal to or less than about 40 nm, and in more detail, equal to or less than about 30 nm. In this range, color purity or color reproducibility may be improved. In addition, because light emitted through the quantum dot is emitted in all directions, a viewing angle of the light may be improved.

In the quantum dot, a shell material and a core material may have different energy bandgaps. For example, the energy bandgap of the shell material may be larger than that of the core material. In another embodiment, the energy bandgap of the shell material may be smaller than that of the core material. The quantum dot may have a multilayered shell. In the multilayered shell, the energy bandgap of an outer layer may be larger than that of an inner layer (e.g., a layer closer to the core). In the multilayered shell, the energy bandgap of the outer layer may be smaller than the energy bandgap of the inner layer.

The quantum dot may control an absorption/emission wavelength by controlling a composition and size thereof. A maximum emission peak wavelength of the quantum dot may have a wavelength range of ultraviolet rays to infrared rays or higher.

The quantum dot may include an organic ligand (e.g., having a hydrophobic moiety and/or a hydrophilic moiety). The organic ligand moiety may be bonded to a surface of the quantum dot. The organic ligand includes RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof. Herein, each R may independently indicate a C3 to C40 (e.g., C5 or more and C24 or less) substituted or unsubstituted alkyl, a C3 to C40 substituted or unsubstituted aliphatic hydrocarbon group such as a substituted or unsubstituted alkenyl, a C6 to C40 (e.g., C6 or more and C20 or less) substituted or unsubstituted aromatic hydrocarbon group such as a substituted or unsubstituted C6 to C40 aryl group, or a combination thereof.

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributylamine, and trioctylamine; a carboxylic acid compound such as methanic acid, ethanic acid, propanoic acid, butanoic acid, pentanoic acid, hexanoic acid, heptanoic acid, octanoic acid, dodecanoic acid, hexadecanoic acid, octadecanoic acid, oleic acid, and benzoic acid; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine compound or an oxide compound thereof such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, trioctyl phosphine oxide, diphenyl phosphine, a triphenyl phosphine compound or an oxide compound thereof; or a C5 to C20 alkyl phosphinic acid such as hexylphosphinic acid, octylphosphinic acid, dodecanephosphinic acid, tetradecanephosphinic acid, hexadecanephosphinic acid, or octadecanephosphinic acid, but the present disclosure is not limited thereto. The quantum dot may contain a hydrophobic organic ligand alone or as a mixture of one or more. The hydrophobic organic ligand (e.g., an acrylate group, a methacrylate group, etc.) may not contain a photopolymerizable moiety.

The scattering bodies 302a, 302b, and 331c may increase light efficiency by scattering light incident onto the first color conversion layer 330a, the second color conversion layer 330b, and the transmission layer 330c, respectively.

In some embodiments, a reflective layer may be further disposed on a side surface and an upper surface of the partition wall 410 (e.g., a surface that is not in contact with the color filters 230a, 230b, and 230c among outer surfaces of the partition wall 410). The reflective layer may include a metal (e.g., aluminum (Al) or silver (Ag)) that reflects light. The reflective layer may reflect the light incident on the partition wall 410 to emit light back toward the second substrate 210, thereby increasing light efficiency. For example, compared to a case in which there is no reflective layer, the light efficiency may be increased by at least about 20%.

The spacer 31 is disposed on the sub-transmission layer 330c1 disposed in the first sub-opening 41a of the partition wall 410.

The second insulating layer 510 may be disposed on the partition wall 410, the first color conversion layer 330a, the second color conversion layer 330b, the transmission layer 330c, the sub-transmission layer 330c1, and the spacer 31.

The second insulating layer 510 disposed on the first color conversion layer 330a, the second color conversion layer 330b, the transmission layer 330c, the sub-transmission layer 330c1, and the spacer 31 prevents or substantially prevents components of the filling layer (e.g., see 520 in FIG. 1), which may be injected when the color conversion panel 2000 is attached to the display panel, from flowing into the first color conversion layer 330a, the second color conversion layer 330b, and the transmission layer 330c, by covering and protecting the first color conversion layer 330a, the second color conversion layer 330b, and the transmission layer 330c.

As described above, in the color conversion panel 2000 and the display device 100 including the same according to one or more embodiments of the present disclosure, the partition wall 410 may have the first sub-opening 41a in which the sub-transmission layer 330c1 is disposed, and the spacer 31 may be disposed on the sub-transmission layer 330c1 disposed in the first sub-opening 41a. In addition, the first sub-opening 41a may be connected to the third opening 420c in which the transmission layer 330c is disposed.

As such, it may be possible to prevent or substantially prevent a height of the spacer 31 from being unnecessarily large (e.g., unnecessarily high) when compared to a case where the spacer 31 is formed on the partition wall 410, by forming the spacer 31 on the sub-transmission layer 330c1 disposed in the first sub-opening 41a of the partition wall 410. In more detail, when the first color conversion layer 330a, the second color conversion layer 330b, and the transmission layer 330c are formed by an inkjet method after the partition wall 410 is formed, ink may remain on a surface of the partition wall 410, and a height of the surface of the partition wall 410 may be increased by the ink remaining on the surface of the partition wall 410. Accordingly, the height of the spacer 31 formed on the partition wall 410 may be increased. However, in accordance with one or more embodiments of the present disclosure, it may be possible to prevent or substantially prevent the height of the spacer 31 from being unnecessarily large (e.g., unnecessarily high), and it may be easier to control the height of the spacer 31, and thus, it may be possible to prevent or substantially prevent deterioration of a display quality that may occur due to a height difference between a plurality of the spacers 31.

As illustrated in FIG. 3, the first area Ra in which light of the second wavelength is emitted and the third area Rc in which light of the first wavelength is emitted may be alternately disposed along a first direction, and the first area Ra, the third area Rc, and the second area Rb in which light of the third wavelength is emitted may be alternately disposed along a second direction crossing the first direction.

The first area Ra, the second area Rb, and the third area Rc may each have a polygonal planar shape, but may have different planar areas from each other.

In addition, a fourth opening 430a and a fifth opening 430b of the partition wall 410 may be disposed in an area surrounded (e.g., around a periphery thereof) by the first area Ra, the second area Rb, and the third area Rc.

The fourth opening 430a and fifth opening 430b, which are additional openings formed in the partition wall 410, may provide a region in which ink dripped on the partition wall 410 during the inkjet process may be collected, thereby preventing or substantially preventing the ink from remaining on the partition wall 410.

The sub-transmission layer 330c1 may be disposed within the first sub-opening 41a of the partition wall 410, and the spacer 31 may be disposed on the sub-transmission layer 330c1 disposed within the first sub-opening 41a of the partition wall 410.

A method of manufacturing a color conversion panel according to an embodiment will be described with reference to FIG. 4 to FIG. 7 together with FIG. 1 to FIG. 3. FIG. 4 to FIG. 7 illustrate a manufacturing method of a color conversion panel according to (e.g., depending on) an order of a manufacturing process according to an embodiment.

Figure 4:
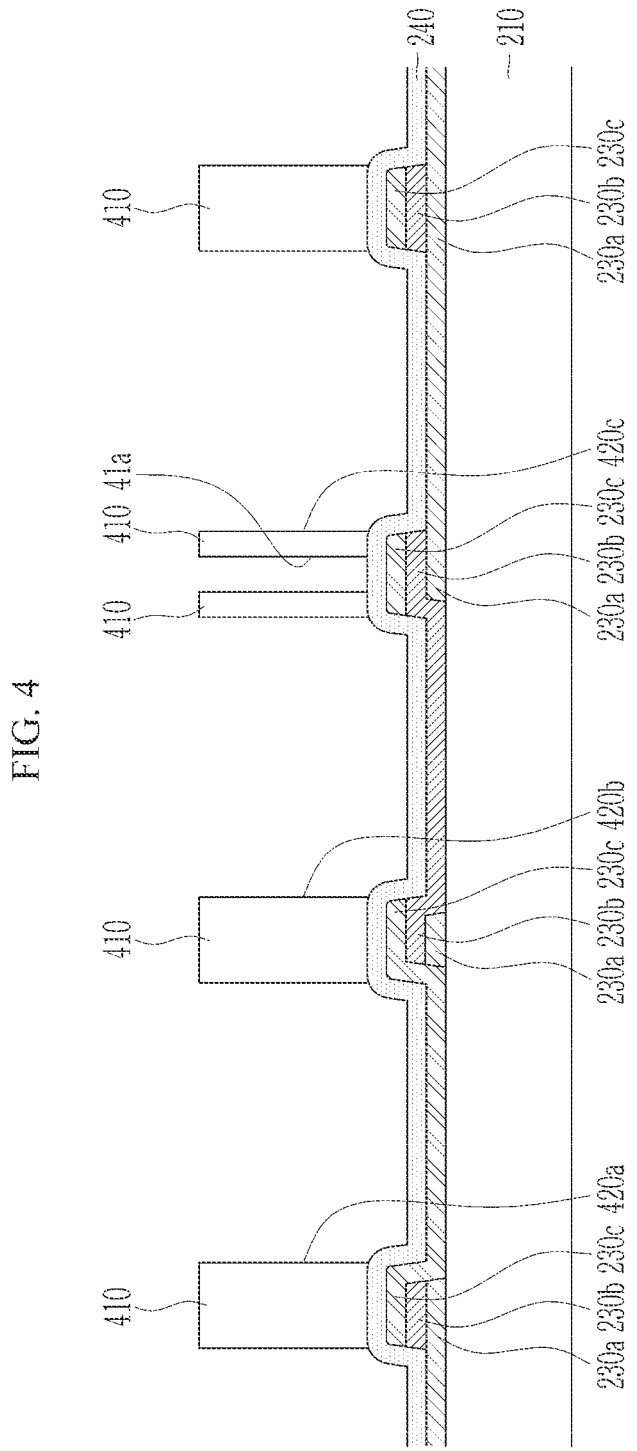
FIGS. 4-7 illustrate a manufacturing method of a color conversion panel according to an order of a manufacturing process according to an embodiment.

As illustrated in FIG. 4, the first color filter 230a, the second color filter 230b, and the third color filter 230c are formed on the second substrate 210. The first insulating layer 240 is formed on the first color filter 230a, the second color filter 230b, and the third color filter 230c. The partition wall 410 having the first opening 420a overlapping with the third color filter 230c, the second opening 420b overlapping with the second color filter 230b, and the third opening 420c overlapping with the first color filter 230a is formed on the first insulating layer, and the first sub-opening 41a of the partition wall 410 overlapping with the light blocking region 220 where the first color filter 230a, the second color filter 230b, and the third color filter 230c overlap with each other is formed on the light blocking region 220 formed by overlapping the first color filter 230a, the second color filter 230b, and the third color filter 230c with each other. As illustrated in FIG. 3, the first sub-opening 41a of the partition wall 410 may be formed to be connected to the third opening 420c of the partition wall 410.

Figure 5:
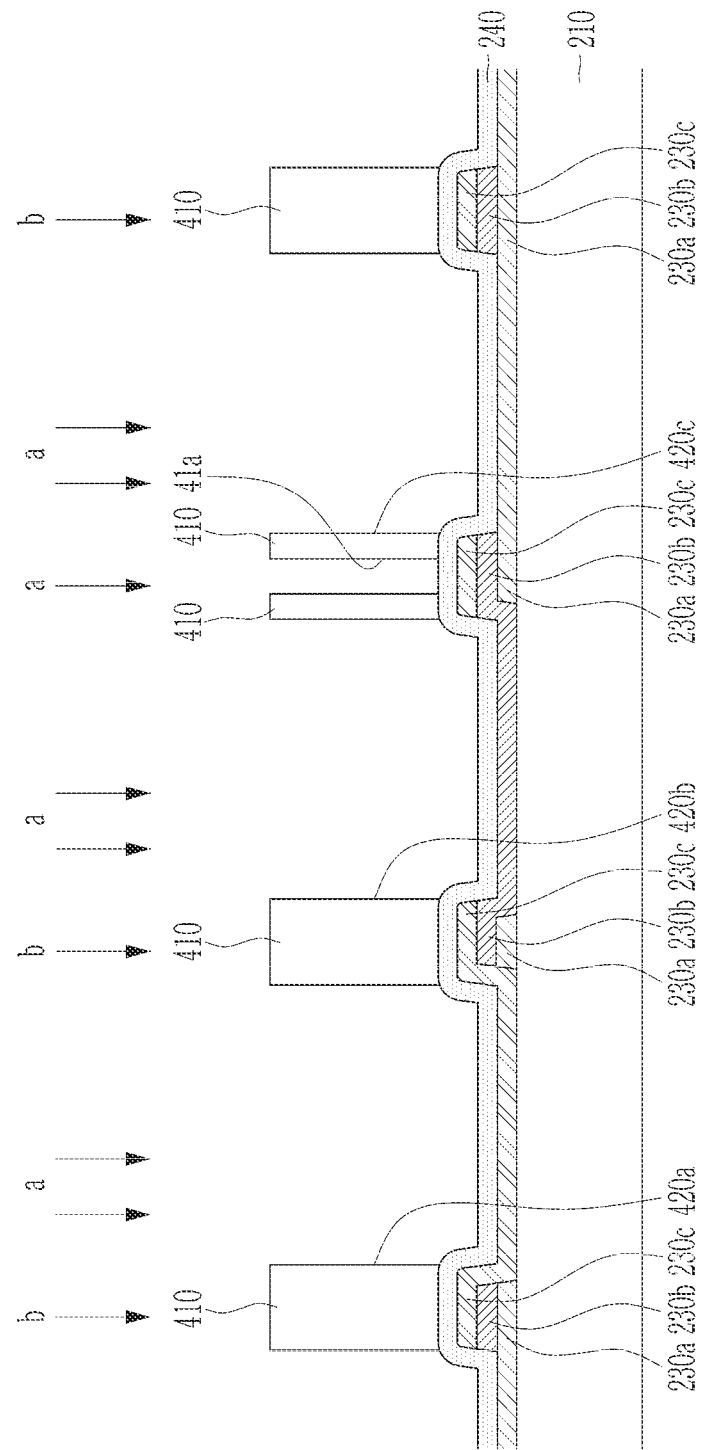
Figure 6:
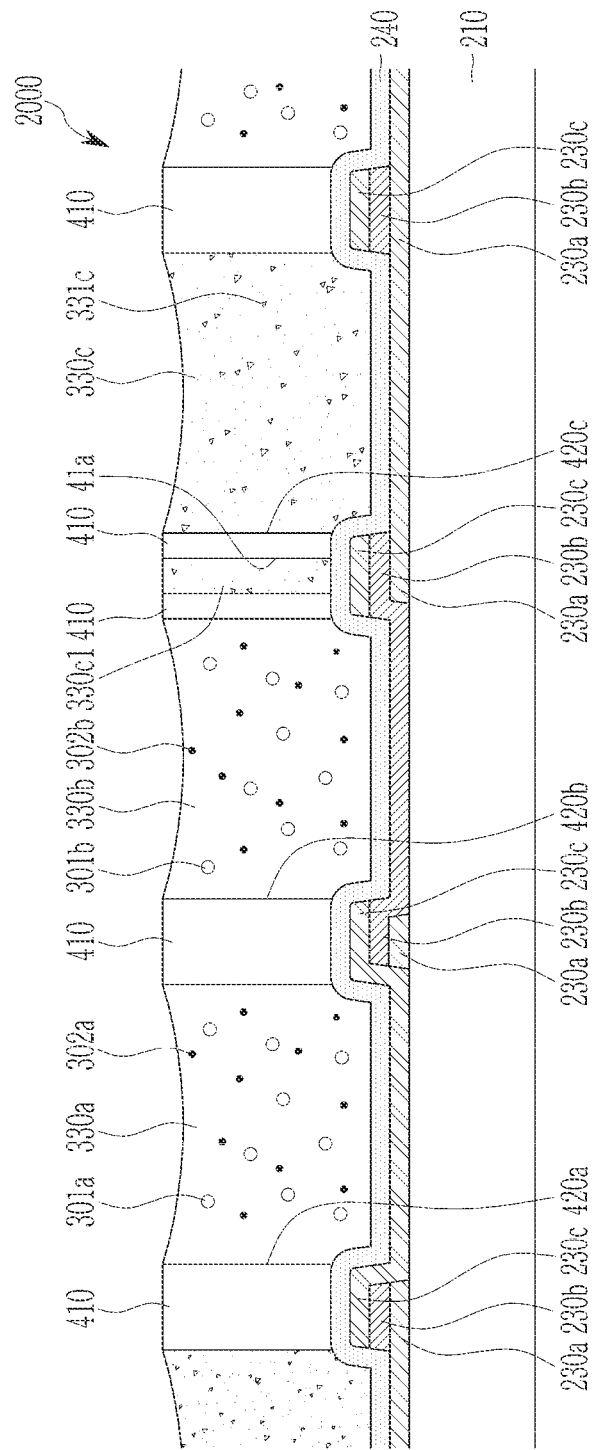

Next, the first color conversion layer 330a, the second color conversion layer 330b, the transmission layer 330c, and the sub-transmission layer 330c1 are formed as illustrated in FIG. 6, by sequentially dripping an ink material constituting the first color conversion layer 330a, the second color conversion layer 330b, the transmission layer 330c, and the sub-transmission layer 330c1 as illustrated in FIG. 5.

The first color conversion layer 330a is formed to be disposed in the first opening 420a of the partition wall 410, the second color conversion layer 330b is formed to be disposed in the second opening 420b of the partition wall 410, and the transmission layer 330c is formed to be disposed in the third opening 420c of the partition wall 410. In addition, the sub-transmission layer 330c1 is formed to be disposed in the first sub-opening 41a of the partition wall 410.

When the first color conversion layer 330a, the second color conversion layer 330b, the transmission layer 330c, and the sub-transmission layer 330c1 are formed by an inkjet method, most of ink a is dripped into the first opening 420a, the second opening 420b, the third opening 420c, and the first sub-opening 41a, and some of ink b may be dripped onto the partition wall 410. As such, when the ink b dripped on to the partition wall 410 remains on the partition wall 410 as it is cured, a surface height of the partition wall 410 may be made non-uniform. As illustrated in FIG. 3, the partition wall 410 may further include the fourth opening 430a and the fifth opening 430b, so that the ink b dripped on the partition wall 410 may be collected in the fourth opening 430a and the fifth opening 430b. According, it may be possible to prevent or substantially prevent a surface height of the partition wall 410 from becoming non-uniform.

Figure 7:
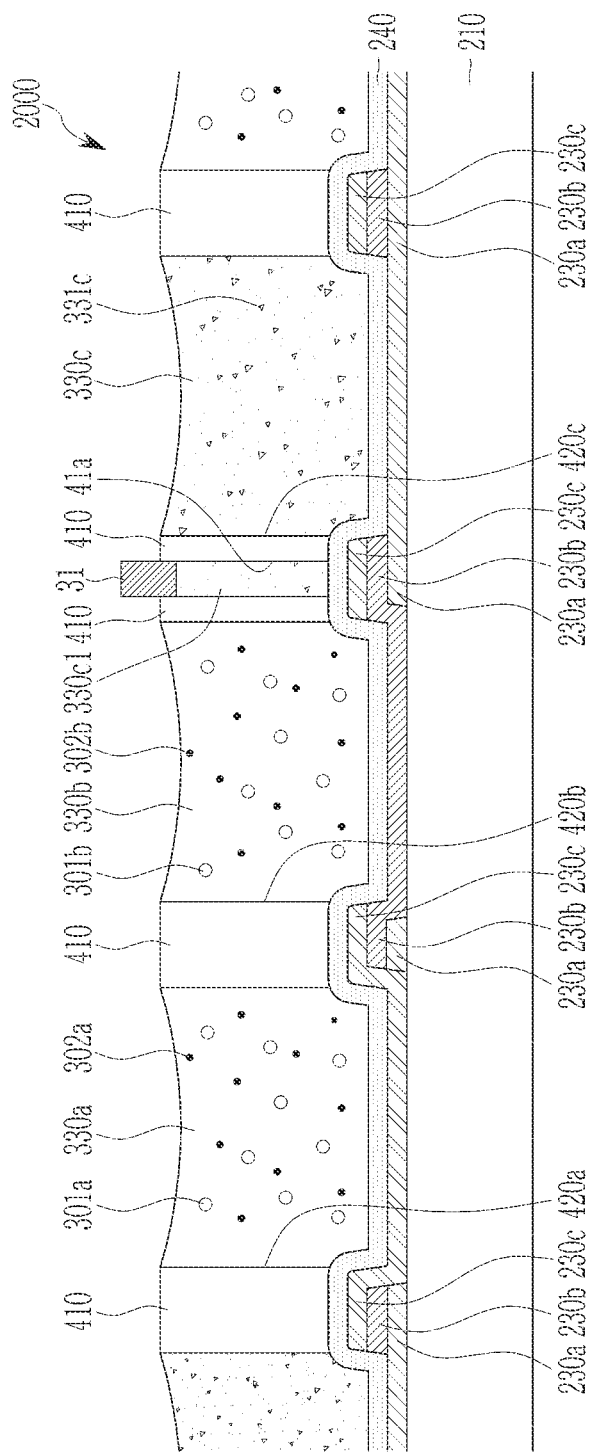

Next, as illustrated in FIG. 7, the spacer 31 is formed on the sub-transmission layer 330c1 disposed in the first sub-opening 41a of the partition wall 410.

As such, it may be possible to prevent or substantially prevent a height of the spacer 31 from being unnecessarily large (e.g., unnecessarily high) when compared to a case where the spacer 31 is formed on the partition wall 410, by forming the spacer 31 on the sub-transmission layer 330c1 disposed in the first sub-opening 41a of the partition wall 410. In more detail, when the first color conversion layer 330a, the second color conversion layer 330b, and the transmission layer 330c are formed by an inkjet method after the partition wall 410 is formed, ink may remain on a surface of the partition wall 410, and a height of the surface of the partition wall 410 may be increased by the ink remaining on the surface of the partition wall 410. Accordingly, in this case, the height of the spacer 31 formed on the partition wall 410 may be increased. However, in accordance with one or more embodiments of the present disclosure, it may be possible to prevent or substantially prevent the height of the spacer 31 from being unnecessarily large (e.g., unnecessarily high), and it may be easier to control the height of the spacer 31, and thus, it may be possible to prevent or substantially prevent deterioration of a display quality that may occur due to a height difference between a plurality of the spacers 31.

Figure 8:
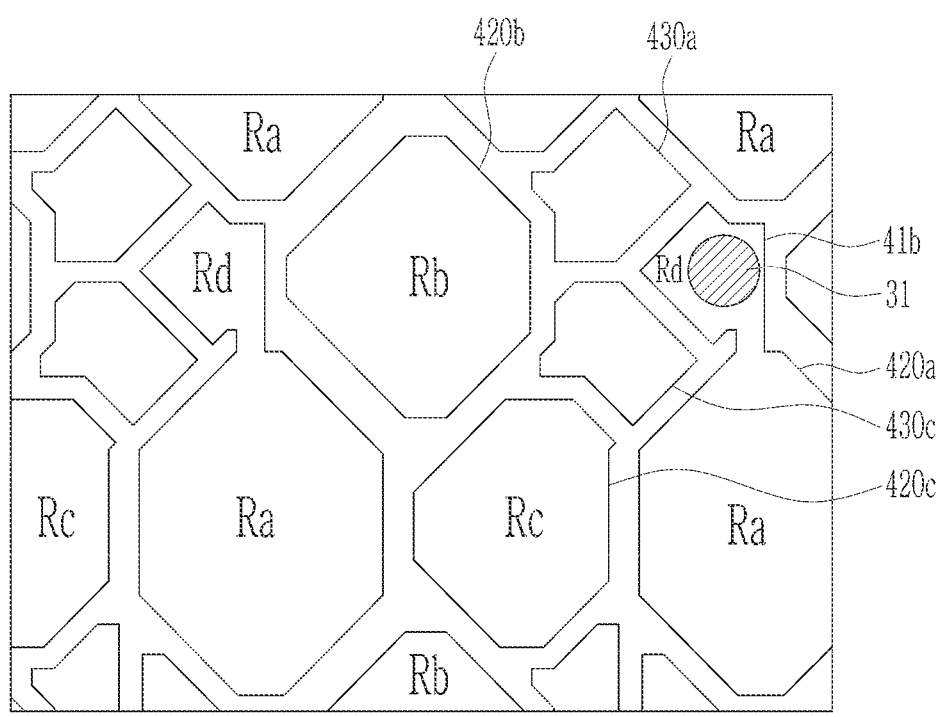
FIG. 8 illustrates a top plan view of a color conversion panel according to another embodiment.

Hereinafter, a color conversion panel according to another embodiment will be described with reference to FIG. 8. FIG. 8 illustrates a top plan view of a color conversion panel according to another embodiment.

Referring to FIG. 8, the color conversion panel according to the present embodiment may be similar to the color conversion panel according to the embodiments described above with reference to FIG. 1 to FIG. 3. Accordingly, redundant description of same or substantially the same (or similar) constituent elements as those described above may not be repeated.

However, unlike the color conversion panel according to the above-described embodiments, the partition wall 410 includes a second sub-opening 41b that is connected to the first opening 420a in which the first color conversion layer 330a is disposed, and may further include a sixth opening 430c spaced apart from the third opening 420c unlike the first sub-opening 41a described with reference to the above-described embodiments. In addition, the spacer 31 of the color conversion layer according to the present embodiment may be disposed on a sub-color conversion layer disposed in the second sub-opening 41b connected to the first opening 420a in which the first color conversion layer 330a is disposed. Accordingly, the fourth region Rd in which the spacer 31 is disposed may be connected to the first area Ra defined by the first opening 420a in which the first color conversion layer 330a is disposed.

The sub-color conversion layer disposed in the second sub-opening 41b may be disposed at (e.g., in or on) the same layer as that of the first color conversion layer 330a.

As such, the partition wall 410 includes the second sub-opening 41b in which the sub-color conversion layer is disposed, and the height of the spacer 31 may be prevented or substantially prevented from becoming unnecessarily large (e.g., unnecessarily high), thereby making it easier to control the height of the spacer 31, and thus, display quality deterioration that may occur due to a height difference between the spacers 31 may be prevented or substantially prevented compared to a case where the spacer 31 is formed on the partition wall 410, by forming the spacer 31 on the sub-color conversion layer of the fourth area Rd defined by the second sub-opening 41b.

All other features of the display device, the color conversion panel, and the manufacturing method of the color conversion panel described above with reference to FIG. 1 to FIG. 3 and FIG. 4 to FIG. 7 may be applicable to the color conversion panel according to the present embodiment, and thus, redundant description thereof may not be repeated.

Figure 9:
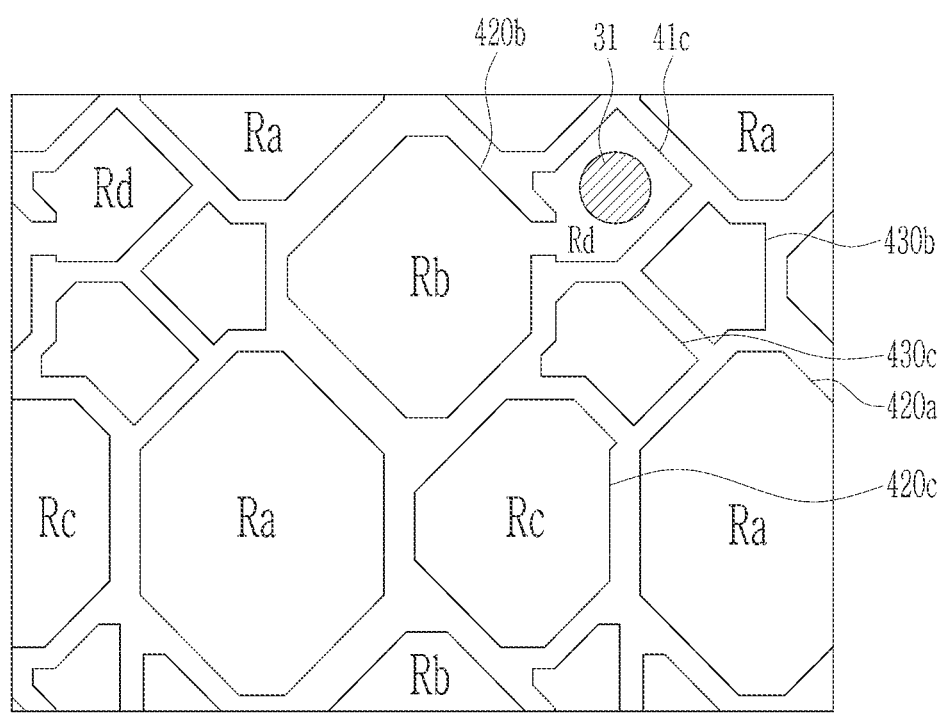
FIG. 9 illustrates a top plan view of a color conversion panel according to another embodiment.

Next, a color conversion panel according to another embodiment will be described hereinafter with reference to FIG. 9. FIG. 9 illustrates a top plan view of a color conversion panel according to another embodiment.

Referring to FIG. 9, the color conversion panel according to the present embodiment is similar to the color conversion panel according to the embodiments described above with reference to FIG. 1 to FIG. 3. Accordingly, redundant description of same or substantially the same (or similar) constituent elements as those described above may not be repeated.

However, unlike the color conversion panel according to the above-described embodiments, the partition wall 410 includes a third sub-opening 41c connected to the second opening 420b in which the second color conversion layer 330b is disposed, and may further include a sixth opening 430c spaced apart from the third opening 420c unlike the first sub-opening 41a described with reference to the above-described embodiments. In addition, the spacer 31 of the color conversion layer according to the present embodiment may be disposed on a sub-color conversion layer disposed in the third sub-opening 41c connected to the second opening 420b in which the second color conversion layer 330b is disposed. Accordingly, the fourth region Rd in which the spacer 31 is disposed may be connected to the second area Rb defined by the second opening 420b in which the second color conversion layer 330b is disposed.

The sub-color conversion layer disposed in the third sub-opening 41c may be disposed at (e.g., in or on) the same layer as that of the second color conversion layer 330b.

As such, the partition wall 410 includes the third sub-opening 41c in which the sub-color conversion layer is disposed, and the height of the spacer 31 may be prevented or substantially prevented from becoming unnecessarily large (e.g., unnecessarily high), thereby making it easier to control the height of the spacer 31, and thus, display quality deterioration that may occur due to a height difference between the spacers 31 may be prevented or substantially prevented compared to a case where the spacer 31 is formed on the partition wall 410, by forming the spacer 31 on the sub-color conversion layer of the fourth area Rd defined by the third sub-opening 41c.

All other features of the display device, the color conversion panel, and the manufacturing method of the color conversion panel described above with reference to FIG. 1 to FIG. 3 and FIG. 4 to FIG. 7 may be applicable to the color conversion panel according to the present embodiment, and thus, redundant description thereof may not be repeated.

Figure 10:
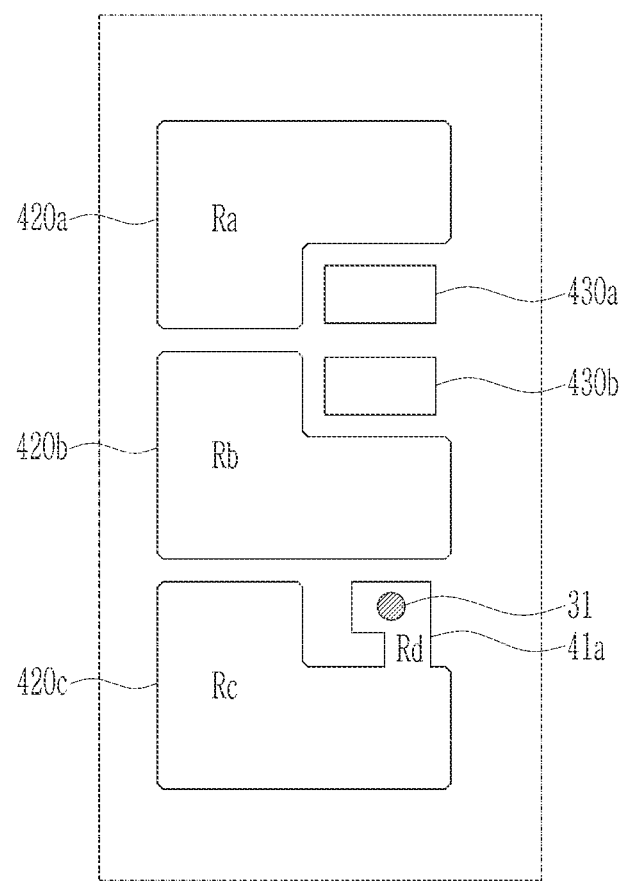
FIG. 10 illustrates a top plan view of a color conversion panel according to another embodiment.

Hereinafter, a color conversion panel according to another embodiment will be described with reference to FIG. 10. FIG. 10 illustrates a top plan view of a color conversion panel according to another embodiment.

Referring to FIG. 10, the partition wall 410 of the color conversion panel according to the present embodiment may have the first opening 420a in which the first color conversion layer 330a is disposed, the second opening 420b in which the second color conversion layer 330b is disposed, the third opening 420c in which the transmission layer 330c is disposed, and the first sub-opening 41a in which the sub-transmission layer is disposed.

The first area Ra defined by the first opening 420a, the second area Rb defined by the second opening 420b, and the third area Rc defined by the third opening 420c may have the same or substantially the same planar area as each other.

The first area Ra defined by the first opening 420a and in which the first color conversion layer 330a is disposed, the second area Rb defined by the second opening 420b and in which the second color conversion layer 330b is disposed, and the third area Rc defined by the third opening 420c and in which the transmission layer 330c is disposed may be arranged sequentially in a side-by-side manner.

The first sub-opening 41a of the partition wall 410 may be disposed adjacent to (e.g., next to) the third opening 420c of the partition wall 410 to be connected to the third opening 420c.

The partition wall 410 may further include the fourth opening 430a disposed adjacent to (e.g., next to) the first opening 420a, and the fifth opening 430b disposed adjacent to (e.g., next to) the second opening 420b.

The spacer 31 may be disposed on the sub-transmission layer disposed in the fourth area Rd defined by the first sub-opening 41a.

As such, it may be possible to prevent or substantially prevent a height of the spacer 31 from being unnecessarily large (e.g., unnecessarily high) compared to a case where the spacer 31 is formed on the partition wall 410, by forming the spacer 31 on the sub-transmission layer disposed in the first sub-opening 41a of the partition wall 410. Further, it may be possible to prevent or substantially prevent the height of the spacer 31 from being unnecessarily large (e.g., unnecessarily high), and it may be easier to control the height of the spacer 31, and thus, it may be possible to prevent or substantially prevent deterioration of a display quality that may occur due to a height difference between the spacers 31.

Figure 11:
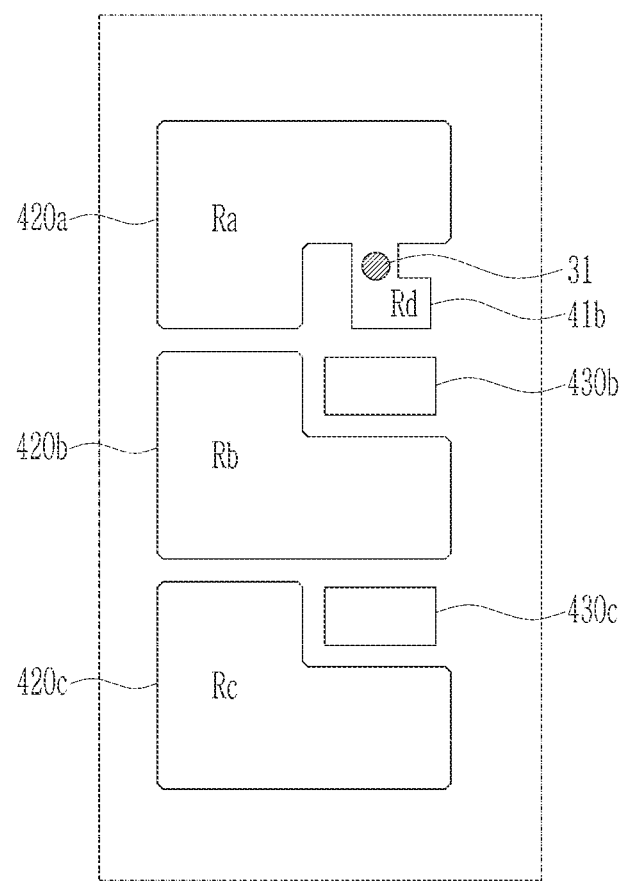
FIG. 11 illustrates a top plan view of a color conversion panel according to another embodiment.

Hereinafter, a color conversion panel according to another embodiment will be described with reference to FIG. 11. FIG. 11 illustrates a top plan view of a color conversion panel according to another embodiment.

Referring to FIG. 11, the color conversion panel according to the present embodiment is similar to the color conversion panel according to the embodiment described above with reference to FIG. 10. Accordingly, redundant description of the same or substantially the same (or similar) constituent elements as those described above may not be repeated.

However, unlike the color conversion panel according to the embodiment of FIG. 10, in accordance with the color conversion layer according to the present embodiment, the partition wall 410 includes a second sub-opening 41b connected to the first opening 420a in which the first color conversion layer 330a is disposed, and further includes a sixth opening 430c spaced apart from the third opening 420c instead of the first sub-opening 41a described in the above-described embodiment. In addition, the spacer 31 of the color conversion layer according to the present embodiment may be disposed on a sub-color conversion layer disposed in the second sub-opening 41b connected to the first opening 420a in which the first color conversion layer 330a is disposed. Accordingly, the fourth region Rd in which the spacer 31 is disposed may be connected to the first area Ra defined by the first opening 420a in which the first color conversion layer 330a is disposed.

The sub-color conversion layer disposed in the second sub-opening 41b may be disposed at (e.g., in or on) the same layer as that of the first color conversion layer 330a.

As such, the partition wall 410 includes the second sub-opening 41b in which the sub-color conversion layer is disposed, and the height of the spacer 31 may be prevented or substantially prevented from becoming unnecessarily large (e.g., unnecessarily high), thereby making it easier to control the height of the spacer 31, and preventing or substantially preventing a display quality deterioration that may occur due to a height difference between the spacers 31 when compared to a case where the spacer 31 is formed on the partition wall 410, by forming the spacer 31 on the sub-color conversion layer of the fourth area Rd defined by the second sub-opening 41b.

All other features of the display device, the color conversion panel, and the manufacturing method of the color conversion panel described above with reference to FIG. 1 to FIG. 3 and FIG. 4 to FIG. 7 may be applicable to the color conversion panel according to the present embodiment, and thus, redundant description thereof may not be repeated.

Figure 12:
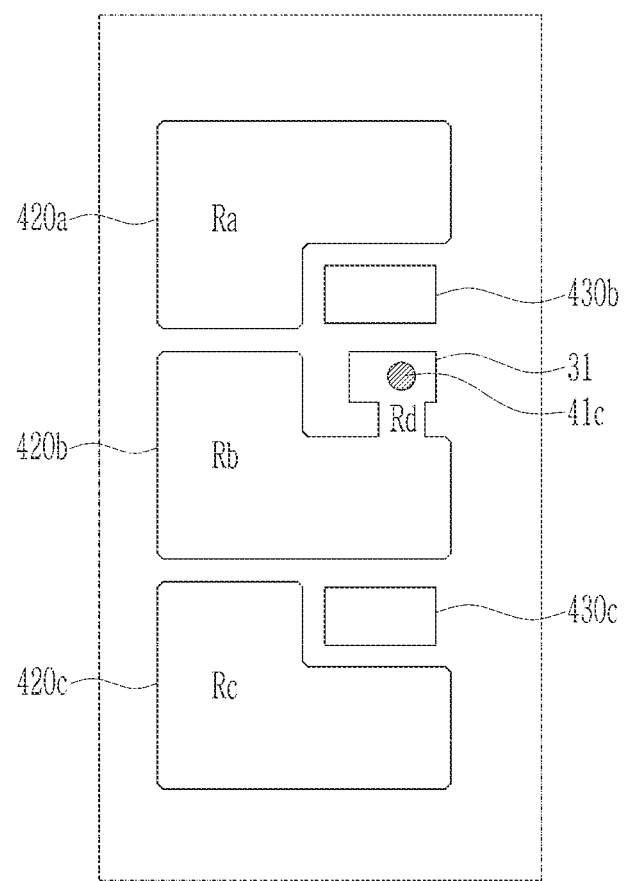
FIG. 12 illustrates a top plan view of a color conversion panel according to another embodiment.

Next, a color conversion panel according to another embodiment will be described with reference to FIG. 12. FIG. 12 illustrates a top plan view of a color conversion panel according to another embodiment.

Referring to FIG. 12, the color conversion panel according to the present embodiment is similar to the color conversion panel according to the embodiment described above with reference to FIG. 10. Accordingly, redundant description of the same or substantially the same (or similar) constituent elements as those described above may not be repeated.

However, unlike the color conversion panel according to the above-described embodiment, in accordance with the color conversion layer according to the present embodiment, the partition wall 410 includes a third sub-opening 41c connected to the second opening 420b in which the second color conversion layer 330b is disposed, and further includes a sixth opening 430c spaced apart from the third opening 420c instead of the first sub-opening 41a described in the above-described embodiment. In addition, the spacer 31 of the color conversion layer according to the present embodiment may be disposed on a sub-color conversion layer disposed in the third sub-opening 41c connected to the second opening 420b in which the second color conversion layer 330b is disposed. Accordingly, the fourth region Rd in which the spacer 31 is disposed may be connected to the second area Rb defined by the second opening 420b in which the second color conversion layer 330b is disposed.

The sub-color conversion layer disposed in the third sub-opening 41c may be disposed at (e.g., in or on) the same layer as that of the second color conversion layer 330b.

As such, the partition wall 410 includes the third sub-opening 41c in which the sub-color conversion layer is disposed, and the height of the spacer 31 may be prevented or substantially prevented from becoming unnecessarily large (e.g., unnecessarily high), thereby making it easier to control the height of the spacer 31, and preventing or substantially preventing a display quality deterioration that may occur due to a height difference between the spacers 31 when compared to a case where the spacer 31 is formed on the partition wall 410, by forming the spacer 31 on the sub-color conversion layer of the fourth area Rd defined by the third sub-opening 41c.

All other features of the display device, the color conversion panel, and the manufacturing method of the color conversion panel described above with reference to FIG. 1 to FIG. 3 and FIG. 4 to FIG. 7 may be applicable to the color conversion panel according to the present embodiment, and thus, redundant description thereof may not be repeated.

Figure 13:
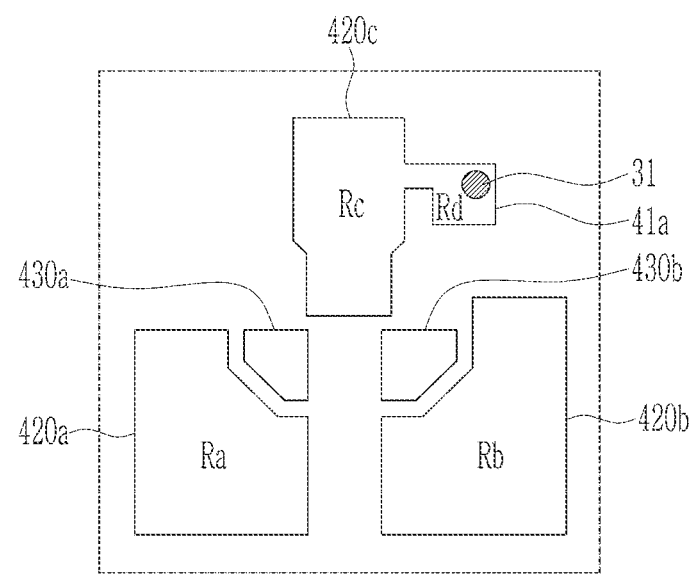
FIG. 13 illustrates a top plan view of a color conversion panel according to another embodiment.

Hereinafter, a color conversion panel according to another embodiment will be described with reference to FIG. 13. FIG. 13 illustrates a top plan view of a color conversion panel according to another embodiment.

Referring to FIG. 13, the partition wall 410 of the color conversion panel according to the present embodiment may have the first opening 420a in which the first color conversion layer 330a is disposed, the second opening 420b in which the second color conversion layer 330b is disposed, the third opening 420c in which the transmission layer 330c is disposed, and the first sub-opening 41a in which the sub-transmission layer is disposed.

The first area Ra defined by the first opening 420a, the second area Rb defined by the second opening 420b, and the third area Rc defined by the third opening 420c may have different planar areas from each other.

The first area Ra defined by the first opening 420a and in which the first color conversion layer 330a is disposed and the second area Rb defined by the second opening 420b and in which the second color conversion layer 330b is disposed may be disposed on their side surfaces, and the third area Rc defined by the third opening 420c and in which the transmission layer 330c is disposed may be disposed above the first area Ra and the second area Rb.

The first sub-opening 41a of the partition wall 410 may be disposed adjacent to (e.g., next to) the third opening 420c of the partition wall 410 to be connected to the third opening 420c.

The partition wall 410 may further include the fourth opening 430a disposed adjacent to (e.g., next to) the first opening 420a, and the fifth opening 430b disposed adjacent to (e.g., next to) the second opening 420b.

The spacer 31 may be disposed on the sub-transmission layer disposed in the fourth area Rd defined by the first sub-opening 41a.

As such, it may be possible to prevent or substantially prevent a height of the spacer 31 from being unnecessarily large (e.g., unnecessarily high) when compared to a case where the spacer 31 is formed on the partition wall 410, by forming the spacer 31 on the sub-transmission layer disposed in the first sub-opening 41a of the partition wall 410. Further, it may be possible to prevent or substantially prevent the height of the spacer 31 from being unnecessarily large (e.g., unnecessarily high), and it may be easier to control the height of the spacer 31, and thus, it may be possible to prevent or substantially prevent deterioration of a display quality that may occur due to a height difference between the spacers 31.

Figure 14:
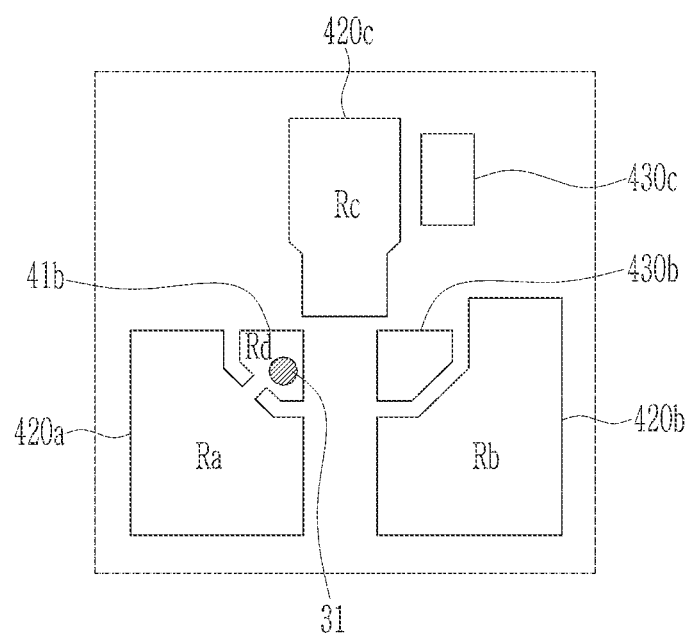
FIG. 14 illustrates a top plan view of a color conversion panel according to another embodiment.

Next, a color conversion panel according to another embodiment will be described with reference to FIG. 14. FIG. 14 illustrates a top plan view of a color conversion panel according to another embodiment.

Referring to FIG. 14, the color conversion panel according to the present embodiment is similar to the color conversion panel according to the embodiment described above with reference to FIG. 13. Accordingly, redundant description of the same or substantially the same (or similar) constituent elements as those described above may not be repeated.

However, unlike the color conversion panel according to the embodiment of FIG. 13, in accordance with the color conversion layer according to the present embodiment, the partition wall 410 includes a second sub-opening 41b connected to the first opening 420a in which the first color conversion layer 330a is disposed, and further includes a sixth opening 430c spaced apart from the third opening 420c instead of the first sub-opening 41a described in the above-described embodiment. In addition, the spacer 31 of the color conversion layer according to the present embodiment may be disposed on a sub-color conversion layer disposed in the second sub-opening 41b connected to the first opening 420a in which the first color conversion layer 330a is disposed. Accordingly, the fourth region Rd in which the spacer 31 is disposed may be connected to the first area Ra defined by the first opening 420a in which the first color conversion layer 330a is disposed.

The sub-color conversion layer disposed in the second sub-opening 41b may be disposed at (e.g., in or on) the same layer as that of the first color conversion layer 330a.

As such, the partition wall 410 includes the second sub-opening 41b in which the sub-color conversion layer is disposed, and the height of the spacer 31 may be prevented or substantially prevented from becoming unnecessarily large (e.g., unnecessarily high), thereby making it easier to control the height of the spacer 31, and preventing or substantially preventing a display quality deterioration that may occur due to a height difference between the spacers 31 when compared to a case where the spacer 31 is formed on the partition wall 410, by forming the spacer 31 on the sub-color conversion layer of the fourth area Rd defined by the second sub-opening 41b.

All other features of the display device, the color conversion panel, and the manufacturing method of the color conversion panel described above with reference to FIG. 1 to FIG. 3 and FIG. 4 to FIG. 7 may be applicable to the color conversion panel according to the present embodiment, and thus, redundant description thereof may not be repeated.

Figure 15:
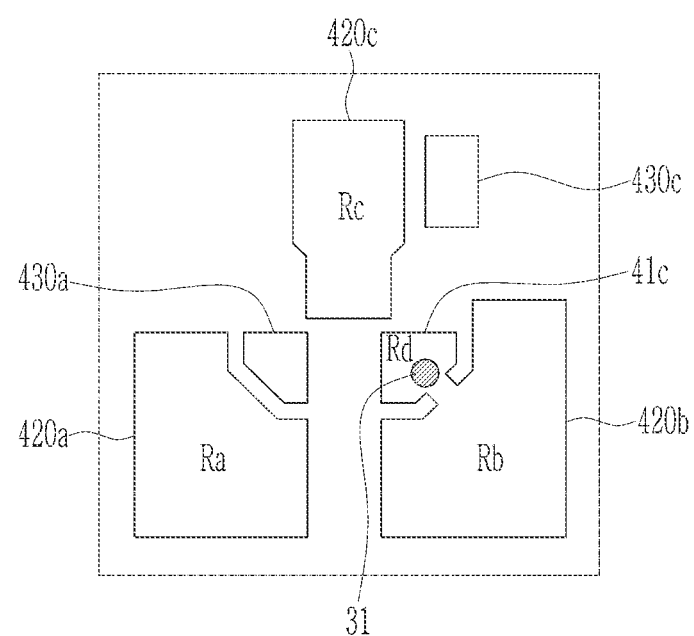
FIG. 15 illustrates a top plan view of a color conversion panel according to another embodiment.

Next, a color conversion panel according to another embodiment will be described with reference to FIG. 15. FIG. 15 illustrates a top plan view of a color conversion panel according to another embodiment.

Referring to FIG. 15, the color conversion panel according to the present embodiment is similar to the color conversion panel according to the embodiment described above with reference to FIG. 13. Accordingly, redundant description of the same or substantially the same (or similar) constituent elements as those described above may not be repeated.

However, unlike the color conversion panel according to the above-described embodiment, in accordance with the color conversion layer according to the present embodiment, the partition wall 410 includes a third sub-opening 41c connected to the second opening 420b in which the second color conversion layer 330b is disposed, and further includes a sixth opening 430c spaced apart from the third opening 420c instead of the first sub-opening 41a described in the above-described embodiment. In addition, the spacer 31 of the color conversion layer according to the present embodiment may be disposed on a sub-color conversion layer disposed in the third sub-opening 41c connected to the second opening 420b in which the second color conversion layer 330b is disposed. Accordingly, the fourth region Rd in which the spacer 31 is disposed may be connected to the second area Rb defined by the second opening 420b in which the second color conversion layer 330b is disposed.

The sub-color conversion layer disposed in the third sub-opening 41c may be disposed at (e.g., in or on) the same layer as that of the second color conversion layer 330b.

As such, the partition wall 410 includes the third sub-opening 41c in which the sub-color conversion layer is disposed, and the height of the spacer 31 may be prevented or substantially prevented from becoming unnecessarily large (e.g., unnecessarily high), thereby making it easier to control the height of the spacer 31, and preventing or substantially preventing a display quality deterioration that may occur due to a height difference between the spacers 31 when compared to a case where the spacer 31 is formed on the partition wall 410, by forming the spacer 31 on the sub-color conversion layer of the fourth area Rd defined by the third sub-opening 41c.

All other features of the display device, the color conversion panel, and the manufacturing method of the color conversion panel described above with reference to FIG. 1 to FIG. 3 and FIG. 4 to FIG. 7 may be applicable to the color conversion panel according to the present embodiment, and thus, redundant description thereof may not be repeated.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

DESCRIPTION OF SYMBOLS

1000: display panel
2000: color conversion panel
110, 210: substrate
230a, 230b, 230c: color filter
410: Partition wall
420a, 420b, 420c, 430a, 430b, 430c: opening
41a, 41b, 41c: sub-opening
330a, 330b: color conversion layer
330c: transmission layer
301a, 301b: quantum dots
302a, 302b, 331c: scattering body
240, 510: insulating layer
520: filling layer

What is claimed is:

1. A color conversion panel comprising:
a substrate;
a plurality of color filters on the substrate;
a partition wall on the substrate, and including a first opening, a second opening, a third opening, and a sub-opening;
a first color conversion layer located in the first opening of the partition wall; a second color conversion layer located in the second opening of the partition wall;
a transmission layer located in the third opening of the partition wall;
an additional layer located in the sub-opening of the partition wall; and
a spacer on the additional layer, wherein, in a plan view, the spacer overlaps with the sub-opening and is spaced apart from the first opening, the second opening, and the third opening, and
wherein, in the plan view, an area of the sub-opening is smaller than each of areas of the first opening, the second opening, and the third opening.

2. The color conversion panel of claim 1, wherein:
the sub-opening is connected to the third opening; and
the additional layer is at a same layer as that of the transmission layer.

3. The color conversion panel of claim 2, wherein the partition wall further includes a fourth opening spaced from the first opening, the second opening, and the third opening.

4. The color conversion panel of claim 3, wherein:
the transmission layer is configured to transmit light of a first wavelength;
the first color conversion layer is configured to convert the light of the first wavelength to light of a second wavelength;
the second color conversion layer is configured to convert the light of the first wavelength to light of a third wavelength,
the color filters comprise a first color filter, a second color filter, and a third color filter;
the first color filter, the second color filter, and the third color filter overlap with each other at a light blocking region;
the partition wall overlaps with the light blocking region;
the first opening overlaps with the third color filter;
the second opening overlaps with the second color filter; and
the third opening overlaps with the first color filter.

5. The color conversion panel of claim 1, wherein:
the sub-opening is connected to the first opening or the second opening; and
the additional layer is at a same layer as that of the first color conversion layer or the second color conversion layer.

6. The color conversion panel of claim 5, wherein the partition wall further includes a fourth opening spaced from the first opening, the second opening, and the third opening.

7. The color conversion panel of claim 6, wherein:
the transmission layer is configured to transmit light of a first wavelength;
the first color conversion layer is configured to convert the light of the first wavelength to light of a second wavelength;
the second color conversion layer is configured to convert the light of the first wavelength to light of a third wavelength;
the color filters comprise a first color filter, a second color filter, and a third color filter;
the first color filter, the second color filter, and the third color filter overlap with each other at a light blocking region;
the partition wall overlaps with the light blocking region;

the first opening overlaps with the third color filter;
the second opening overlaps with the second color filter; and
the third opening overlaps with the first color filter.

8. A display device comprising:
a display panel comprising:
a first substrate;
a thin film transistor on the first substrate;
a pixel definition layer on the thin film transistor; and
a plurality of emission layers at regions defined by the pixel definition layer;
a second substrate facing the first substrate; a plurality of color filters between the first substrate and the second substrate;
a partition wall between the second substrate and the color filters, and including a first opening, a second opening, a third opening, and a sub-opening;
a first color conversion layer located in the first opening of the partition wall; a second color conversion layer located in the second opening of the partition wall;
a transmission layer located in the third opening of the partition wall;
an additional layer located in the sub-opening of the partition wall; and
a spacer overlapping with the additional layer,
wherein, in a plan view, the spacer overlaps with the sub-opening and is spaced apart from the first opening, the second opening, and the third opening, and
wherein, in the plan view, an area of the sub-opening is smaller than each of areas of the first opening, the second opening, and the third opening.

9. The display device of claim 8, wherein:
the sub-opening is connected to the third opening; and
the additional layer is at a same layer as that of the transmission layer.

10. The display device of claim 9, wherein the partition wall further includes a fourth opening spaced from the first opening, the second opening, and the third opening.

11. The display device of claim 10, wherein:
the transmission layer is configured to transmit light of a first wavelength;
the first color conversion layer is configured to convert the light of the first wavelength to light of a second wavelength;
the second color conversion layer is configured to convert the light of the first wavelength to light of a third wavelength;
the color filters comprise a first color filter, a second color filter, and a third color filter;
the first color filter, the second color filter, and the third color filter overlap with each other at a light blocking region;
the partition wall overlaps with the light blocking region;
the first opening overlaps with the third color filter;
the second opening overlaps with the second color filter; and
the third opening overlaps with the first color filter.

12. The display device of claim 8, wherein:
the sub-opening is connected to the first opening or the second opening; and
the additional layer is at a same layer as that of the first color conversion layer or the second color conversion layer.

13. The display device of claim 12, wherein the partition wall further includes a fourth opening spaced from the first opening, the second opening, and the third opening.

14. The display device of claim 13, wherein:
the transmission layer is configured to transmit light of a first wavelength;
the first color conversion layer is configured to convert the light of the first wavelength to light of a second wavelength;
the second color conversion layer is configured to convert the light of the first wavelength to light of a third wavelength;
the color filters comprise a first color filter, a second color filter, and a third color filter;
the first color filter, the second color filter, and the third color filter overlap with each other at a light blocking region;
the partition wall overlaps with the light blocking region;
the first opening overlaps with the third color filter;
the second opening overlaps with the second color filter; and
the third opening overlaps with the first color filter.

15. A manufacturing method of a color conversion panel, comprising:
forming a plurality of color filters on a substrate;
forming a partition wall including a first opening, a second opening, a third opening, and a sub-opening on the color filters;
forming a first color conversion layer in the first opening of the partition wall;
forming a second color conversion layer in the second opening of the partition wall;
forming a transmission layer in the third opening of the partition wall;
forming an additional layer in the sub-opening of the partition wall; and
forming a spacer on the additional layer,
wherein, in a plan view, the spacer overlaps with the sub-opening and is spaced apart from the first opening, the second opening, and the third opening, and
wherein, in the plan view, an area of the sub-opening is smaller than each of areas of the first opening, the second opening, and the third opening.

16. The manufacturing method of claim 15, wherein the forming of the first color conversion layer, the forming of the second color conversion layer, and the forming of the transmission layer are performed utilizing an inkjet process.

17. The manufacturing method of claim 16, further comprising forming a fourth opening spaced from the first opening, the second opening, and the third opening in the forming of the partition wall,
wherein an ink dripped on the partition wall is disposed in the fourth opening in the inkjet process.

18. The manufacturing method of claim 15, wherein the sub-opening is formed to be connected to at least one of the first opening, the second opening, or the third opening.

19. The manufacturing method of claim 18, wherein:
the sub-opening is formed to be connected to the third opening; and
the additional layer is formed of a same layer as that of the transmission layer.

20. The manufacturing method of claim 18, wherein:
the sub-opening is formed to be connected to the first opening or the second opening; and
the additional layer is formed at a same layer as that of the first color conversion layer or the second color conversion layer.

21. An electronic device comprising a display device, the display device comprising:
a display panel comprising:
a first substrate;
a thin film transistor on the first substrate;
a pixel definition layer on the thin film transistor; and
a plurality of emission layers at regions defined by the pixel definition layer;
a second substrate facing the first substrate;
a plurality of color filters between the first substrate and the second substrate;
a partition wall between the second substrate and the color filters, and including a first opening, a second opening, a third opening, and a sub-opening;
a first color conversion layer located in the first opening of the partition wall;
a second color conversion layer located in the second opening of the partition wall;
a transmission layer located in the third opening of the partition wall;
an additional layer located in the sub-opening of the partition wall; and
a spacer overlapping with the additional layer, wherein, in a plan view, the spacer overlaps with the sub-opening and is spaced apart from the first opening, the second opening, and the third opening, and
wherein, in the plan view, an area of the sub-opening is smaller than each of areas of the first opening, the second opening, and the third opening.

22. The electronic device of claim 21, wherein:
the sub-opening is connected to the third opening; and
the additional layer is at a same layer as that of the transmission layer.

* * * * *